United States Patent [19]

Abele

[11] Patent Number: 4,998,083

[45] Date of Patent: Mar. 5, 1991

[54] YOKELESS PERMANENT MAGNET STRUCTURE AND METHOD OF CONSTRUCTION

[75] Inventor: Manlio G. Abele, New York, N.Y.

[73] Assignee: New York University, New York, N.Y.

[21] Appl. No.: 431,041

[22] Filed: Nov. 2, 1989

[51] Int. Cl.$^5$ ............................................. H01F 7/02
[52] U.S. Cl. ..................................... 335/302; 335/306; 29/607
[58] Field of Search ............... 335/296, 297, 302, 303, 335/301, 304, 306

[56] References Cited

U.S. PATENT DOCUMENTS

| | | | |
|---|---|---|---|
| 3,205,415 | 9/1965 | Seki et al. | 335/301 X |
| 3,768,054 | 10/1973 | Neugebauer | 335/304 |
| 4,647,887 | 3/1987 | Leupold | 335/306 X |

Primary Examiner—George Harris
Attorney, Agent, or Firm—Darby & Darby

[57] ABSTRACT

The construction of a yokeless permanent magnet structure with a cavity, which structure comprises a single layer of abutted magnetic prisms, is performed by first utilizing a reference point "F" for the construction such that point F lies on a equipotential line of zero potential. The point F must, furthermore, be selected so that it lies on a line which divides the magnetic flux within the cavity into two separate loops or parts. Beginning from point F, the magnet structure is then constructed from a series of precisely abutted prisms of magnetic material which form a cavity with a predetermined, uniform polygonal cross section. Using well known boundary value conditions between the cavity and the various prisms of the magnetic material, as well as the restriction that the exterior surface of the permanent magnetic must be an equipotential surface of zero potential, each prism, in turn, is constructed, until the entire permanent magnet is completed. It has been found that the amount of magnetic material utilized in the entire permanent magnet structure obtained in this manner is uniquely related to the value K and the location of point F. It is therefore possible to quantify the relationship between the amount of magnetic material in the structure with respect to K and F, whereby a structure with the minimum amount of magnetic material may be obtained.

10 Claims, 5 Drawing Sheets

YOKELESS PERMANENT MAGNET STRUCTURE AND METHOD OF CONSTRUCTION

FIELD OF THE INVENTION

The present invention relates generally to permanent magnet structures and, more particularly, concerns a method for constructing for a hollow, yokeless permanent magnet structure having a prescribed internal magnetic field and utilizing a minimum amount of magnetic material. Such magnets find application, for example, as the bias magnets in nuclear magnetic resonance imaging systems.

BACKGROUND OF THE INVENTION

Nuclear magnetic resonance imaging systems make use of very large permanent magnet structures to provide their magnetic fields. Typically, permanent magnets are arranged in side-by-side arrangement to form a cavity to receive to the patient, in which cavity the magnetic field has a prescribed strength and orientation. Owing to the relatively large size of the cavity, the field produced by the permanent magnets is relatively low and it becomes necessary to utilize a great deal of magnetic material to obtain a useful field strength. The magnets therefore tend to be quite expensive. Significant reduction in the volume of magnetic material required could result in the substantial reduction of the entire nuclear magnetic resonance imaging system.

The usual manner for designing such permanent magnet cavities has been a very approximate one. It is the common practice for the designer of such a magnetic cavity to rely upon well-known structures so as to achieve the desired field or to modify such a structure somewhat by experimentation, in order to approximate the desire field more closely. In any event, the final magnetic structure only loosely approximates the desired result and makes inefficient use of the magnetized material in order to do so. This results in a substantially greater expense being incurred with respect to the permanent magnetic than is necessary.

Another inefficiency in the structure of permanent magnetic cavities arises from the need to confine the magnetic field within the permanent magnet structure. Typically, this has been achieved by providing a high permeability cover or "yoke" on the exterior of the permanent magnet structure, in order to provide a low reluctance return path for the magnetic flux. However, the yoke adds to the size, weight, and expense of the magnetic structure, as well as its cost. Furthermore, the structure utilizing a yoke does not make efficient use of the magnetic field available within the permanent magnet material and, therefore, requires the use of more material than is necessary.

It is therefore an object of the present invention to provide a yokeless permanent magnet cavity in which the magnetic field precisely matches a prescribed field in both magnitude and direction.

It is another object of the present invention to provide a method for constructing a yokeless permanent magnet structure which contains a cavity in which the orientation and magnitude of the magnetic field closely match predetermined values.

It is yet another object of the present invention to provide a method for constructing a yokeless permanent magnet structure having a cavity in which the magnetic field conforms closely with a predetermined orientation and magnitude, while permitting minimization of the amount of magnetic material used.

It is also an object of the present invention to provide a method for constructing a yokeless permanent magnet structure having a cavity in which the magnetic field has a prescribed magnitude and orientation, which method is readily amenable to application in automated equipment, such as computerized design systems.

In accordance with the present invention, the construction of a yokeless permanent magnet structure with a cavity is performed by first selecting a ratio "K" between the magnitudes of the prescribed field intensity within the cavity and the magnetization within the permanent magnet material. A reference point "F" for the construction is also selected within the cavity, such that point F lies on a equipotential line of zero potential. The point F must, furthermore, be selected so that it lies on a line $l_{0h}$ which divides the magnetic flux within the cavity into two separate loops or parts. Beginning from point F, the magnet structure is then constructed from a series of precisely abutted prisms of magnetic material which form a cavity with a predetermined, uniform polygonal cross section. Using well known boundary value conditions between the cavity and the various prisms of the magnetic material, as well as the restriction that the exterior surface of the permanent magnetic must be an equipotential surface of zero potential, each prism, in turn, is constructed, until the entire permanent magnet is completed. It has been found that the amount of magnetic material utilized in the entire permanent magnet structure obtained in this manner is uniquely related to the value K and the location of point F. It is therefore possible to quantify the relationship between the amount of magnetic material and the structure with respect to K and F, whereby a structure with the minimum amount of magnetic material may be obtained.

BRIEF DESCRIPTION OF THE DRAWINGS

The foregoing brief description, as well as further objects, features, and advantages of the present invention will be understood more completely from the following detailed description of a presently preferred, but nonetheless, illustrative embodiment in accordance with the present invention, with reference being had to the drawing, in which.

DETAILED DESCRIPTION OF THE PREFERRED EMBODIMENT

Figure 1:
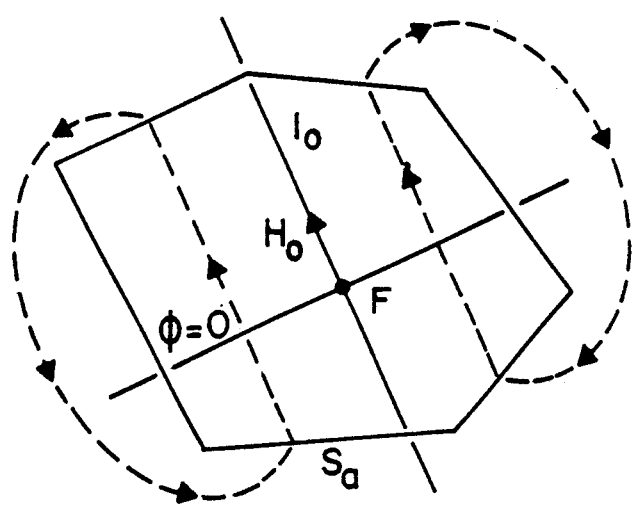
FIG. 1 is a schematic representation of the cavity of a permanent magnet structure illustrating the flux loops and the manner of locating the point F.

The geometry of the magnet cavity is a given and it is desired to generate a magnetic field intensity $\overline{H}_0$ (hereafter, whenever a line appears over a reference character, it will be understood that a vector is involved) therein. A yokeless, single layer magnetic structure is sought which has the same cross-section in all planes parallel to the plane of the drawing and utilizes the minimum amount of material. The magnetic structure will be made up of abutted prisms of magnetized material, and no magnetic flux will exist outside the structure.

Table I presents a summary of a design procedure for a permanent magnet structure incorporating the present invention. The various steps outlined in the table are discussed in detail below.

Once the material of the structure is selected, the magnetization or remanence of the material fixes the constant K defined as:, $$K = H_0/J_0 \qquad (1)$$

where $J_0$ is the magnitude of $\overline{J}$. This means that, at any point in the magnetic structure (i.e. from prism to prism), the orientation of the remanence vector may vary, but its magnitude $J_{j0}$ is constant throughout the structure.

After the material is selected (step 1 in Table I) a point, F, is selected (step 2), which serves as a reference point for constructing the structure. It has been found that, if this point is selected according to the criteria given below, a unique relationship exists between the location of the point F and the amount of magnetic material utilized. This relationship can be quantified and utilized to locate that point F which results in the minimum amount of magnetic material. In A uniform field within the cavity is desired. other words, the flux of the magnetic induction within the cross-section of the cavity is uniform. How flux divides within the magnetic structure is determined by the design of the structure. For purposes of the design, the flux is divided into two parts or loops, and a line $l_{0h}$ is defined which separates the flux loop which closes to the right from the flux loop which closes to the left. The point F is selected so that this line passes through the point F, as indicated in FIG. 1.

Since the magnetic structure has no external yoke of high permeability to close the flux, the external surface of the magnetic structure is designed to be an equipotential surface on which the magnetic potential is the same as the ambient potential outside the structure and the induction $\overline{B}$ has no component perpendicular to the surface. The potential will be assumed to be zero. Consequently, the field is confined within the magnetic structure.

The potential varies within the magnetic structure, and particularly, within the cavity. Equipotential lines within the cavity are perpendicular to the intensity $\overline{H}_0$ and one of these equipotential lines must have the same potential that exits outside the structure, since the potential in the cavity must go from zero to whatever maximum exists and then back to zero again, on the outside surface. The point F is selected to be the point of intersection between this zero equipotential line and the line $l_{0h}$, which divides the loops of the flux of induction within the magnetic structure.

It has been found that the magnet geometry is independent of the orientation of the field intensity and is a function only of K, the ratio of the magnitudes of the desired field and the remanence of the magnetic material, and the position of point F. These two parameters control the full design, which can be performed with any arbitrary orientation of the field intensity. It has been found that the geometry of the magnetic structure is also independent of that orientation.

Figure 2:
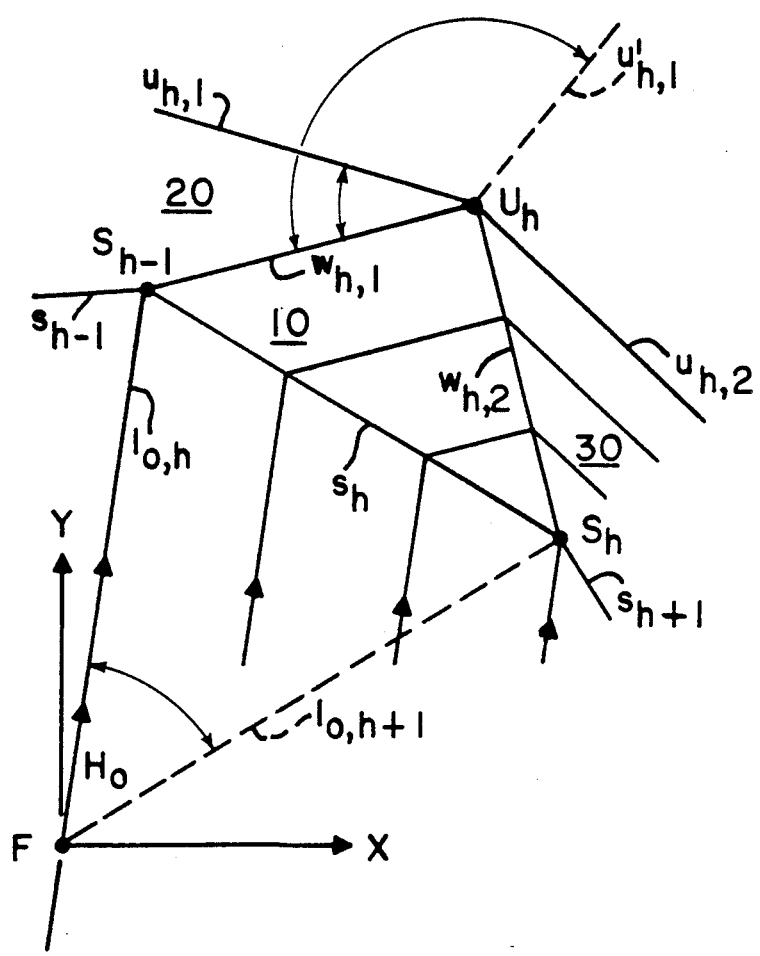
FIG. 2 is a schematic diagram illustrating the construction of a single section or prism in the permanent magnet structure.

After the value of K and the location of point F are selected, it is assumed that line $l_{0h}$ passes through a vertex $S_{h-1}$ of the polygonal boundary of the cavity as shown in FIG. 2. One of the sides bounding the cavity and including point $S_{h-1}$ is designated $s_h$, and the vertex at the opposite end of side $s_h$ is designated $S_h$ (steps 3 and 4).

The construction of the magnetic structure thus begins with this side $s_h$ and the prism or segment of material 10, which it bounds from below. Next, a similar construction of an adjacent segment 20 is completed, and so forth, until the entire structure is complete.

It should be appreciated that, since the orientation of the field will not affect the geometry, it may be selected at the designer's convenience during the construction. The field is therefore selected to be parallel to line $l_{oh}$. Should this not agree with the required orientation, the construction is readily compensated once the entire design is complete.

Figure 3A:
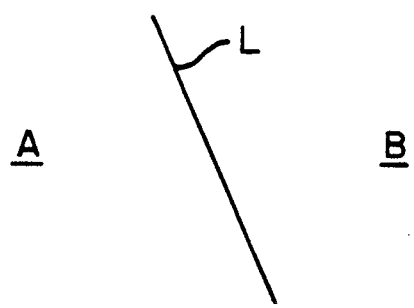
FIGS. 3A and 3B illustrate of use of circle/vector diagrams to solve boundary value problems, with FIG. 3A illustrating the boundary between two different media and FIG. 3B illustrating the use of circle/vector diagrams to derive the various vectors in medium B, given the vectors in medium A.
Figure 3B:
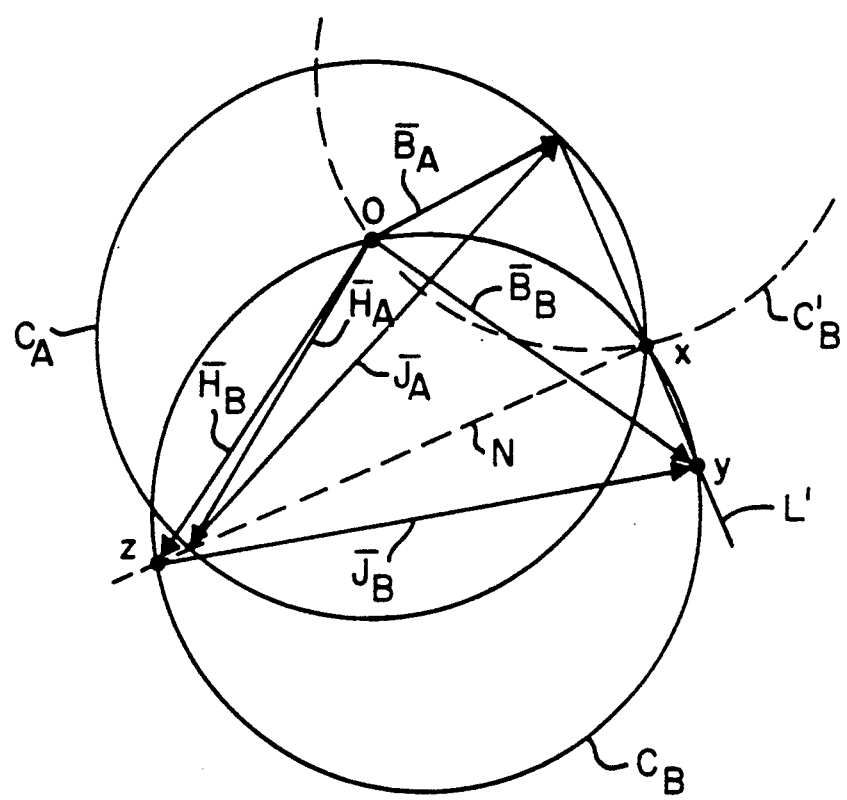

The construction of the structure is facilitated through the use of circle/vector diagrams of the type shown in FIG. 3B. FIG. 3A illustrates the interface, L, between two magnetized media A and B, and FIG. 3B illustrates the use of circle/vector diagrams to derive the vectors $\overline{B}_B$, $\overline{H}_B$ and $\overline{J}_B$ in medium B given the vectors $\overline{B}_A$, $\overline{H}_A$, and $\overline{J}_A$ in medium A. In any medium, remanence or magnetization $\overline{J}$ and magnetic field intensity $\overline{H}$ are related by the equation:

$$B = \mu_o H + J \qquad (2)$$

where $\overline{B}$ is the magnetic induction vector. In CGS units $\mu_0 = 1$ and will be ignored hereafter.

As stated above, the vectors $\overline{B}_A$, $\overline{H}_A$, and $\overline{J}_A$ are assumed to be known and are drawn in the vector diagram of FIG. 3B. A circle $c_A$ is then constructed such that vector $\overline{J}_A$ constitutes a diameter. The procedure of deriving the three vectors in the medium B can then be started. As the first step, a line L' parallel to the interface L is drawn so as to pass through the tip of vector $\overline{B}_A$. The intersection of line L' with circle $c_A$ will be designated as point x, and the tail of vector $\overline{B}_A$ will be designated as point o. A circle having a diameter equal to the magnitude of vector $J_b$ constructed so as to pass through points x and o. For the purposes of our example, the magnitude of $\overline{J}_b$ is considered to be the same as the magnitude of $\overline{J}_A$. Those skilled in the art will therefore appreciate that circle $c_B$ is readily constructed by striking an arc of radius $J_0/2$ from each of points o and x and using the intersection of the two arcs as the center of circle $c_B$. The intersection of line L' with circle $c_B$ is then designated as point y. A line N is then drawn between the tip of vector $\overline{H}_a$ and point x, and line N is extended beyond vector $\overline{H}_A$. Those skilled in the art will appreciate that line N must be perpendicular to the L' at point x. The reason is that, since line L and line N intersect a diameter of circle $c_A$ at opposite ends and point x is on the circumference of the circle, the angle formed by lines L' and N at point x is circumscribed in a semicircle and must therefore be a right angle.

As is well known, two fundamental boundary value conditions must be satisfied at any interface between different materials. The first boundary value condition is that the tangential component of $\overline{H}$ must be continuous across the interface, and the second condition is that the normal component of $\overline{B}$ must be continuous across the interface. Returning now to FIG. 3B and defining the intersection of line N with circle $c_B$ at point z, it will be noted that a vector directed from point o to point z will have the same tangential component as vector $\overline{H}_A$. This is true, because both vectors would originate from point o and terminate on the same normal to line L'. The vector between points o and z is therefore properly defined as vector $\overline{H}_B$ (it may not be the only choice for the vector, as explained more fully below, but it certainly constitutes a proper choice). In addition, a vector drawn between points o and y would have the same normal component as vector $\overline{B}_A$ and would, accordingly, be properly defined as vector $\overline{B}_B$. It will therefore be appreciated that the vector extending from point z to point y is the vector $\overline{J}_B$.

It should be noted that in FIG. 3B, it was possible to draw another circle $c'_A$ (shown fragmented and in dotted lines) which passes through points o and x. This would lead to an entirely different set of vectors $\overline{B}'_B$, $\overline{H}'_B$ and $\overline{J}'_B$ which satisfy all of the boundary conditions. From the geometry of the structure which has already been derived, or from other boundary limitations imposed, it will usually be clear that one circle results in a smaller geometry than the other. It is often advantageous to select that circle which has its center in $c_A$ (i.e. $c_B$ in the present instance).

From the immediately preceding discussion, it will be appreciated that the following procedure (hereafter referred to as "Procedure A") could be utilized to derive the vectors $\overline{B}_B$, $\overline{H}_B$, and $\overline{J}_B$, given the vectors $\overline{B}_A$, $\overline{H}_A$, and $\overline{J}_A$ and the interface L:

1. Draw a line parallel to line L and extending through the tip of $\overline{B}_A$ and into circle $c_A$;
2. Construct circle $c_B$ passing through the tail of $\overline{B}_A$ (point o) and the intersection of line L' with $c_A$ (point x);
3. Draw a line N which passes through point x and the tip of $\overline{H}_A$ (or simply construct a perpendicular at point x);
4. Construct the tail of vector $\overline{J}_B$ at the intersection of line N with circle $c_B$;
5. Construct the tip of vector $\overline{J}_B$ at the intersection of line L' with circle $c_B$ (beyond point x); and
6. Construct vectors $\overline{B}_B$ and $\overline{H}_B$ so as to be consistent with $\overline{J}_B$ (i.e. $\overline{B}_B$ extends from point o to the tip of $\overline{J}_B$, and $\overline{H}_B$ extends from point o to the tail of $\overline{J}_B$).

Having described the basic procedure, Procedure A, for constructing a vector set that will satisfy the boundary conditions between to media, we will now proceed to utilize this procedure for deriving the geometry of the segment 10 for which the line $s_h$ is a lower boundary. A circle $c_0$ is constructed (See FIG. 4) to pass through the tip of vector $\overline{H}_0$ and so that its center is aligned with vector $\overline{H}_0$. Since the cavity cannot be magnetized vector $\overline{B}_0$ coincides with vector $\overline{H}_0$. The line $l_{oh}$ is parallel to $\overline{H}_0$ and passes through the center of circle $c_0$.

Now, the line $s_h$ is drawn in the vector diagram so as to pass through the tip of vector $\overline{H}_0$. The other point of intersection of the line $s_h$ with the circle $c_0$ locates the tip of vector $\overline{J}_h$, the magnetization of segment 10. The vectors $\overline{B}_h$ and $\overline{H}_h$ are readily constructed from point o to the tip and tail of $\overline{J}_h$, respectively (step 5). Thus, at this point the magnetization in the segment 10 is known, and it is known that it must have $s_h$ as one of its boundaries, but the other boundaries, which are needed to close the segment, must still be constructed.

No matter what the orientation of the field, the line $l_{oh}$ divides the flux. If this line $l_{oh}$ passes through point F, that means that all the flux of the magnetic induction to the right of this line bends in one direction into the magnetic system. Furthermore, the vector $\overline{B}_h$ defines the orientation of the flux within the segment 10 bounded by $s_h$. In step 6, a line, $w_{h1}$, is constructed which is parallel to $\overline{B}_h$ and passes through the point $S_{h-1}$. Since line $w_{h1}$ intersects line $l_{oh}$, it must define the leftmost limit of flux within the segment, and it must correspond with a boundary of the segment. In order to define that boundary completely, the end of $w_{h1}$ opposite $S_{h-1}$ must be found. This opposite end of line $w_{h1}$ will be referred to as point $U_h$.

Since point $U_h$ is on the exterior surface of the structure, it must be at zero potential. In step 7, this fact is utilized to locate the point $U_h$. Since points F and $U_h$ are both at zero potential, the potential rise from F to $S_{h-1}$ must equal the potential drop from $S_{h-1}$ to $U_h$, or in mathematical terms:

$$H_0 \cdot l_{oh} = H_h \cdot w_{h1} \qquad (3)$$

where $\overline{l}_{oh}$ is a vector extending along line $l_{oh}$ between points F and $S_{h-1}$, and $\overline{w}_{h1}$ is a vector extending along line $w_{h1}$ between points $S_{h-1}$ and $U_h$. The multiplications are vector "dot products", so this equation merely equates the projection of the intensity along line $l_{oh}$ (multiplied by the length of the line) to the projection of the intensity along line $w_{h1}$ (multiplied by the length of the line). When this equation is solved to obtain the magnitude of $\overline{w}_{h1}$ (the only unknown in the equation), point $U_h$ is located.

After step 7, the geometry of the segment 10 is fully defined, since the third side, $w_{h2}$ merely connects points $U_h$ and $S_h$, both of which have been defined. However the geometry of the present segment imposes constraints on the orientation of the outside surfaces of the two adjacent segments 20 and 30. In step 8, lines defining the orientations of these surfaces, lines $u_{h1}$ and $u_{h2}$ are derived.

Figure 4:
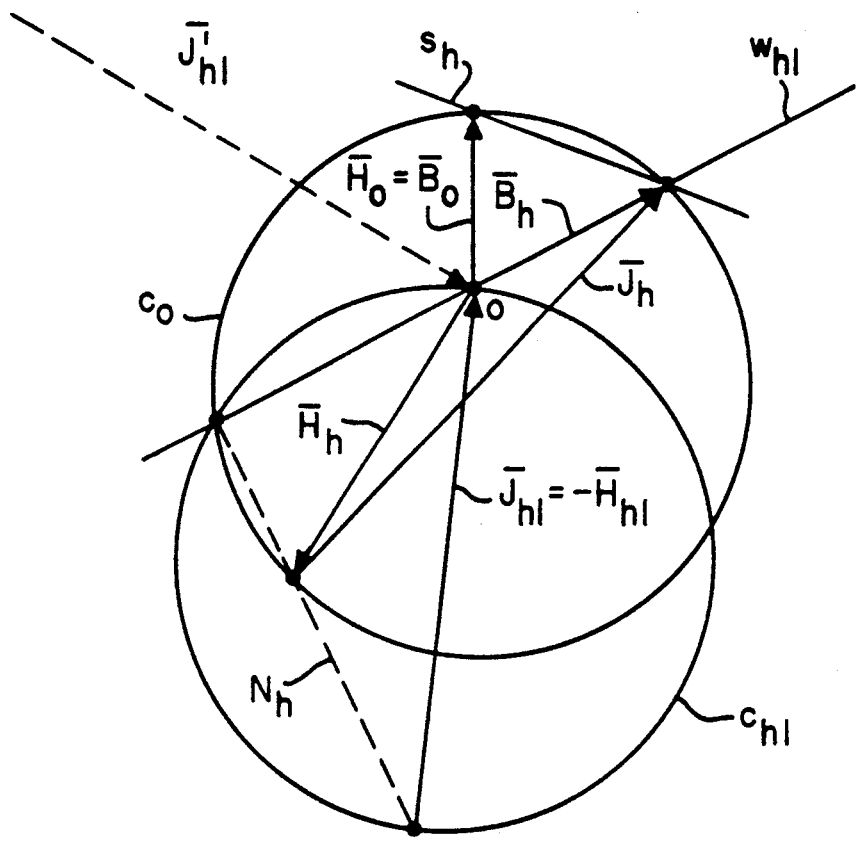
FIG. 4 demonstrates the use of circle/vector diagrams to derive the various vectors in segment 10 and adjacent segment 20.

Step 8 is performed by constructing two additional circles in FIG. 4, $c_{h1}$ and $c'_{h1}$ (not shown) using Procedure A, above. These circles have diameter $J_0$ and pass through the tail of $\overline{H}_0$ and the intersection of line $w_{h1}$ (parallel to $\overline{B}_h$) with circle $c_0$. Two such circles are possible, resulting in the vectors $\overline{J}_{h1}$ and $\overline{J}'_{h1}$, which are alternate solutions to the boundary conditions. As will be appreciated from the construction of $\overline{J}_{h1}$ by Procedure A, $\overline{H}_{h1}$ will be equal but opposite to $\overline{J}_{h1}$. Hence, $\overline{B}_{h1}$ is zero.

The segments 20 and 30 on either side of the present segment 10 have surfaces (e.g. $u_{h1}$) which interface with the environment and are therefore zero potential surfaces. No flux passes through these surfaces, so the $\bar{B}$ vector therein can have no normal component (i.e. $\bar{B}$ is tangent to the surface). Also the magnetic field intensity at these surfaces can have no tangential component and is perpendicular to the surface. In fact, because $\bar{B}_{h1}$ is zero in segment 20, $\bar{J}_{h1}$ is perpendicular $U_{h1}$, so the orientation of $u_{h1}$ is readily determined. In fact, two lines $u_{h1}$ and $u'_{h1}$ (perpendicular to $\bar{J}_{h1}$ and $\bar{J}'_{h1}$, respectively) are constructed and, at step 9, the line is selected which makes the smallest angle with $w_{h1}$.

Figure 5:
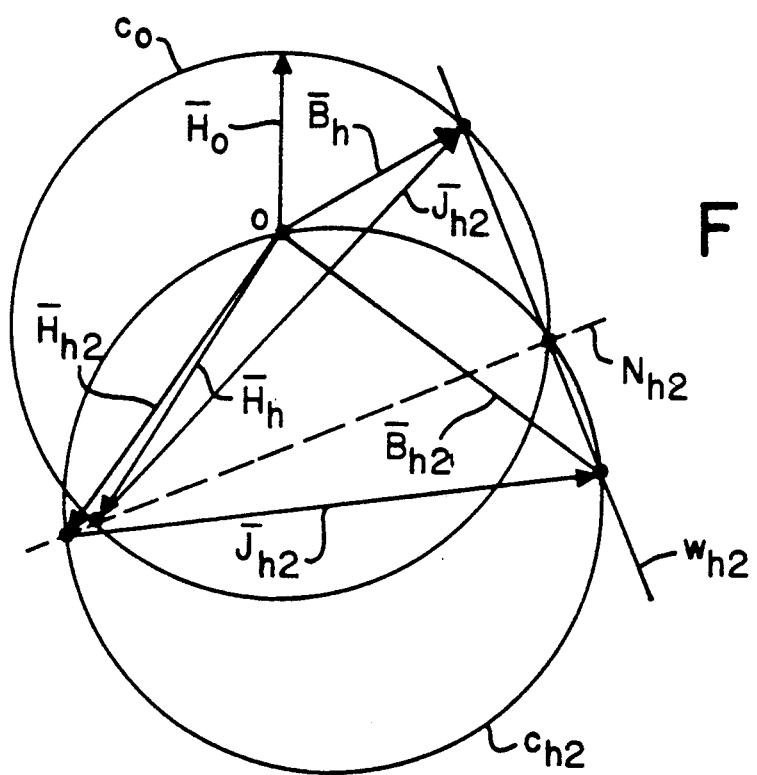
FIG. 5 demonstrates the use of circle/vector diagrams to derive the various vectors in the area 30 adjacent to segment 10.

In FIG. 5, Procedure A is utilized to construct a circle $c_{h2}$ of diameter $J_0$, which passes through the tail of $\bar{H}_0$ and the intersection of line $w_{h2}$ with circle $c_0$. As was the case with circle $c_{h1}$ a second circle $c'_{h2}$ is available (not shown). However, circle $c_{h2}$ provides the smallest angle between $U_{h2}$ and $w_{h2}$ and was therefore selected. Since $J_{h2}$ is a diameter of circle $c_{h2}$, $\bar{H}_{h2}$ and $\bar{B}_{h2}$ must be perpendicular to each other, because they are inscribed in a semicircle. This is clearly consistent with the observation in the previous paragraph that the $\bar{B}$ and $\bar{H}$ vectors must be, respectively, tangent and perpendicular to the external surface of the magnet.

Line $u_{h2}$ of the external boundary is parallel to $\bar{B}_{h2}$. Consequently no flux of $\bar{B}$ crosses $u_{h2}$. Line $u_{h2}$ is perpendicular to $\bar{H}_{h2}$. Thus, $u_{h2}$ is an equipotential line, and because $u_{h2}$ passes through point $U_h$, its potential is zero.

Figure 6:
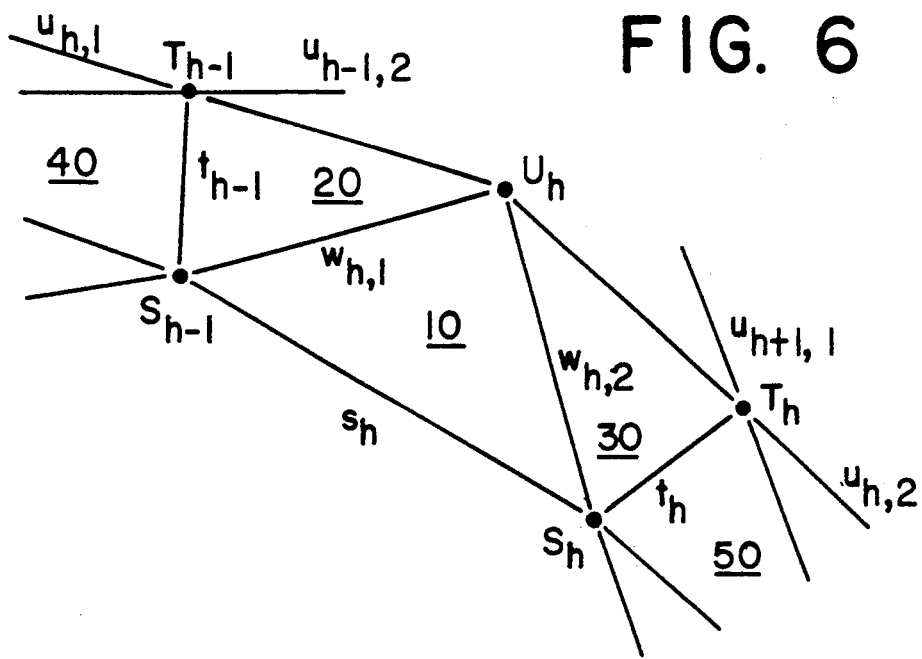
FIG. 6 illustrates the magnet structure after segments including area 20 and 30 have been constructed and the boundary limitations for adjacent areas 40 and 50 have been derived.

In step 12 a new line $l_{0,h+1}$ is selected (See FIGS. 2 and 6) and the entire procedure from steps 4–11 is repeated (step 13), to construct the next segment interfacing on the cavity. In so doing, the field may me selected for convenience in the cavity, and adjustment made in the previous segment, by an equal, but opposite rotation of the field there. With this next segment constructed, the point $T_h$ is constructed by finding the intersection of $u_{h2}$ with $u_{h+1,1}$ (step 14), and interface $t_h$ is constructed by connecting $T_h$ and $S_h$ (step 15). Step 16 shows the vector rotation mentioned above being made in all of the segments at one time to achieve alignment of all of the segments. In step 17, the new $\bar{B}$ and $\bar{H}$ are determine in each segment and, at step 18 the area of the entire magnetic structure is calculated.

At step 19, a new point F is selected, and the entire process in steps 3–17 is repeated for this new F is repeated at step 20. In steps 21–22, a mathematical relationship is established between the various locations of F and the resulting area, and the point resulting in the minimum area is selected. In steps 23–24, this value of F is utilized in the geometry, $\bar{H}_0$ is rotated to the desired orientation, and all other vectors are rotated by equal and opposite angles to compensate for the selected orientations in each segment.

In the design procedure of Table I, a value of K was selected and the location of point F was found which resulted in the minimum area for the magnetic structure. As was pointed out above, the geometry of the magnetic structure will also vary with the value of K. However, it has been found that there is no correlation between F and K, as far as the area of the magnetic structure is concerned. Accordingly, the design procedure in Table I could be repeated in order to minimize the area with respect to K. This involves substituting "F" for "K" in step 1 and "K" for "F" in steps 2, 3, 19, 21, and 22. After this modified repetition of the design procedure is performed, the area of the magnetic structure would be minimized with respect to both K and F.

Figure 7A:
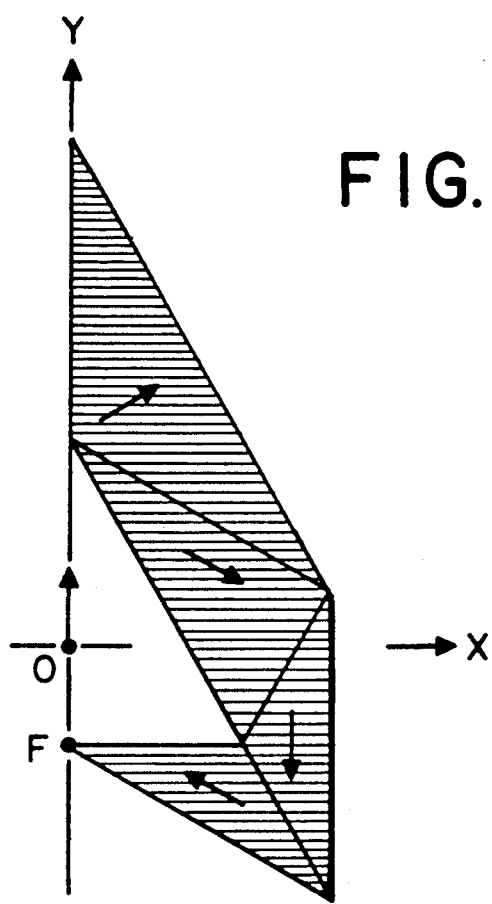
FIGS. 7A, 7B, and 7C depict the construction of a permanent magnet structure with a cavity having the cross-sectional shape of an equilateral triangle, with FIGS. 7A and 7B illustrating the cross-sectional area of the permanent magnet when F is selected at the middle of the base of the triangle and at the upper vertex, respectively (two extremes), and FIG. 7C illustrating the structure when F is selected in the middle of the triangle (minimum area).
Figure 7B:
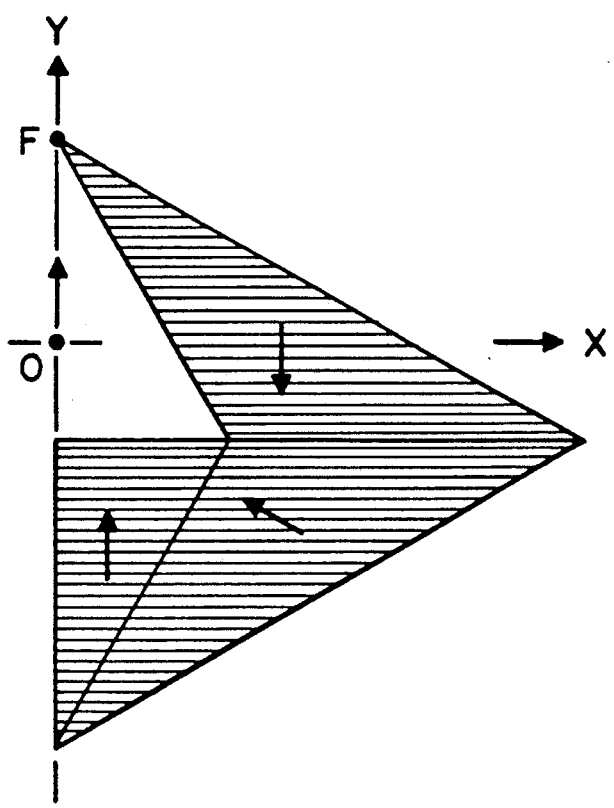
Figure 7C:
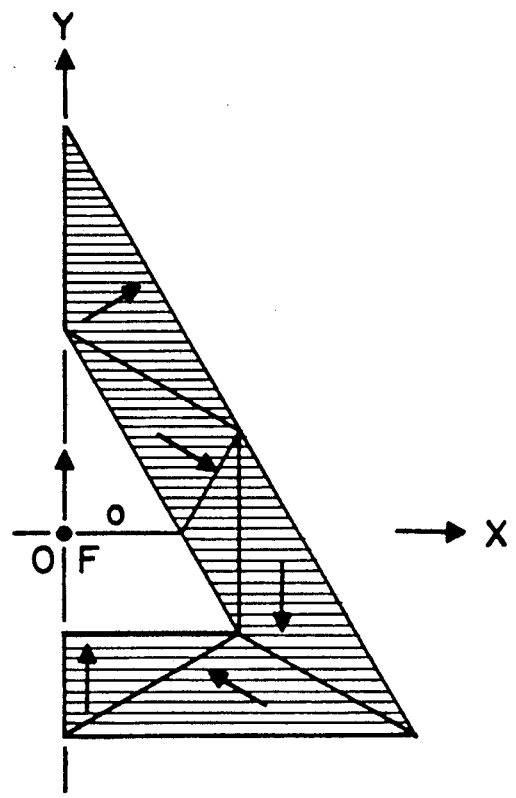

In order to further aid understanding of the invention and to demonstrate optimization with respect to the cross-sectional area of the permanent magnet structure, a specific example is illustrated in FIGS. 7A, 7B, and 7C. In this case, there is illustrated the construction of a permanent magnet structure in which the cavity has the cross-sectional shape of an equilateral triangle. In each of these figures, the resulting structure is symmetrical with respect to the vertical axis, so only the right hand portion of the structure is illustrated in each instance.

In FIGS. 7A and 7B, two extreme locations of the point F are illustrated. In FIG. 7A, point F is selected to be in the center of the base of the triangle, and in FIG. 7B, point F is selected to be at the upper vertex of the triangle. In FIG. 7C, the point F lies at the geometric center 0 of the equilateral triangle. In each of these examples, the arrows in the various magnetic prisms represent the orientation of the remanence vector in that prism. In all three examples, remanence vectors were selected to provide a vertical field intensity $\bar{H}_0$ within the cavity. It will be appreciated that FIG. 7C achieves the minimum area of the three examples. In fact, if additional locations of the point F were selected, it would be found that FIG. 7C achieves the minimum area. This result could, of course, be obtained by following the optimization procedure described above.

Although a preferred embodiment of the invention has been disclosed for a illustrative purposes, those skilled in the art will appreciate that many modifications, additions, and substitutions are possible without departing from the scope and spirit of the invention as defined in the accompanying claims.

TABLE I

DESIGN PROCEDURE

1. Select a value of K
2. Select a point F
3. Select a line $l_{oh}$ between F and a vertex $S_{h-1}$ of the internal polygon of n sides
4. Select the sides $s_h$ between $S_{h-1}$ and $S_h$
5. Determine the orientation of $J_h$ and the values of $B_h$, $H_h$ in medium bounded by $s_h$ by means of a vector diagram inscribed in circle $C_o$
6. Select line $W_{h,1}$ parallel to $B_h$
7. Determine point $U_h$ where potential is zero
8. Determine lines $u_{h,1}$, $u'_{h,1}$ by means of circular diagrams $C_{h,1}$, $C'_{h,1}$
9. Select line $U_{h,1}$ with smallest angle relative to $u_{h,1}$
10. Select line $w_{h,2}$ between $U_h$ and $S_h$
11. Determine line $u_{h,2}$ with smallest relative to $w_{h,2}$
12. Select line $l_{o,h+1}$ between F and $S_h$
13. Repeat steps 4 through 11
14. Determine the intersections $T_h$ between $u_{h,2}$ and $u_{h+1,1}$
15. Determine interface $t_h$ between $S_h$, $T_h$
16. In each (K) region, rotate all Vectors $J_k$ by the sum of all previous vector rotations
17. In each (K) region, determine the new values of vectors $B_k$, $H_k$ in components of (K) region
18. Compute composite area of structure
19. Select a new point F
20. Repeat steps 2 through 15
21. Tabulate areas of magnetic structure versus position of F
22. Select position of F with minimum area
23. Rotate $H_o$ to the desired orientation of the field within the cavity
24. Rotate all vectors $\bar{J}$ by angles equal and opposite to the angle of rotation of $\bar{H}_o$

What is claimed is:

1. A method for constructing a yokeless, permanent magnet structure of the type having a cavity of polygonal cross-section bounded by a plurality of sides and containing a magnetic field of prescribed strength and direction, said method comprising the steps of:
   selecting a reference point F for the construction, such that point F lies on an equipotential line of zero potential and also lies on a line which divides the magnetic flux within the cavity into separate, closed loops on either side of said line; and based upon boundary conditions that must exist between different media and the restriction that the exterior surface of the permanent magnet must be an equipotential surface of zero potential:

constructing a first prism of magnetized material having one surface which corresponds to a first side of bounding said cavity and produces the prescribed field in the portion of the cavity contiguous to said side;

constructing the boundary with the exterior of said magnet structure of further magnetized prisms precisely abutting said first prism on two additional surfaces thereof;

selecting a second side bounding said cavity adjacent to said first side and repeating the preceding two steps; and repeating the three preceding steps until all sides of the cavity have been utilized and the entire magnetic structure is completed.

2. The method of claim 1 wherein said magnet structure is constructed of magnetized prisms in which the remanence has a magnitude $J_0$, said method comprising the initial step of selecting a value of K defined by the equation $$K = H_0/J_0$$

where $H_0$ is the magnitude of the prescribed field intensity in the cavity.

3. The method of claim 2 further comprising selecting a plurality of additional different values of K, constructing a magnetic structure corresponding to each value of K, calculating the total cross-sectional area of the structure corresponding to each value of K, obtaining a quantitative relationship between the cross-sectional area and the value of K, and minimizing the cross-sectional area with respect to K.

4. The method of claim 3 further comprising the steps of selecting a new value of F, constructing the magnetic structure corresponding to that value of F, determining the cross-sectional area of that structure, deriving a quantitative relationship between F and cross-sectional area, and minimizing cross-sectional area with respect to F, whereby a magnetic structure utilizing a minimum amount of magnetic material is obtained.

5. The method of claim 1 further comprising the steps of selecting a new value of F, constructing the magnetic structure corresponding to that value of F, determining the cross-sectional area of that structure, deriving a quantitative relationship between F and cross-sectional area, and minimizing cross-sectional area with respect to F.

6. A yokeless permanent magnet structure having a cavity with a predefined magnetic field therein, said permanent magnet structure being composed of precisely abutted magnetic prisms, said permanent magnet structure having been constructed by the method of claim 1.

7. A yokeless permanent magnet structure having a cavity with a predefined magnetic field therein, said permanent magnet structure being composed of precisely abutted magnetic prisms, said permanent magnet structure having been constructed by the method of claim 2.

8. A yokeless permanent magnet structure having a cavity with a predefined magnetic field therein, said permanent magnet structure being composed of precisely abutted magnetic prisms, said permanent magnet structure having been constructed by the method of claim 3.

9. A yokeless permanent magnet structure having a cavity with a predefined magnetic field therein, said permanent magnet structure being composed of precisely abutted magnetic prisms, said permanent magnet structure having been constructed by the method of claim 4.

10. A yokeless permanent magnet structure having a cavity with a predefined magnetic field therein, said permanent magnet structure being composed of precisely abutted magnetic prisms, said permanent magnet structure having been constructed by the method of claim 5.

* * * * *